United States Patent [19]
Donovan et al.

[11] Patent Number: 5,654,716
[45] Date of Patent: Aug. 5, 1997

[54] CIRCUIT FOR SHORT DURATION MULTIPLE LOOK PULSE BASED FREQUENCY MEASUREMENT

[75] Inventors: Mark J. Donovan, Derry; James C. Patrikis, Nashua, both of N.H.; Irl W. Smith, Concord, Mass.

[73] Assignee: Raytheon Company, Lexington, Mass.

[21] Appl. No.: 622,838

[22] Filed: Mar. 27, 1996

[51] Int. Cl.⁶ .................................................... G01S 7/40
[52] U.S. Cl. ........................... 342/98; 342/174; 342/199
[58] Field of Search ................................ 342/98, 103, 199, 342/174

[56] References Cited

U.S. PATENT DOCUMENTS

| | | | |
|---|---|---|---|
| 3,680,099 | 7/1972 | Herman et al. | 342/199 |
| 4,179,694 | 12/1979 | Alder | 342/100 |
| 4,600,924 | 7/1986 | Lobsinger et al. | 342/98 |
| 4,809,004 | 2/1989 | Brandao et al. | 342/199 |
| 4,982,195 | 1/1991 | Olivenbaum et al. | 342/51 |
| 5,151,703 | 9/1992 | Roos | 342/199 |

*Primary Examiner*—John B. Sotomayor
*Attorney, Agent, or Firm*—Donald F. Mofford

[57] ABSTRACT

A low cost automatic frequency control system measures short duration radio frequencies with high a degree of accuracy within 0.5 MHz. The system is programmable to allow applicability over a wide range of frequencies within the required accuracy and various signal durations. The system includes circuits to digitize the source signal to a digital pulse train and asynchronously sample the pulse train to obtain a count of the positive edges of the pulses over a sufficient number of samples. A microprocessor computes the statistical average of the count and accurately determines the frequency of the source signal. The system further includes a feedback path to implement correction to the source signal based on the measured frequency.

22 Claims, 5 Drawing Sheets

CIRCUIT FOR SHORT DURATION MULTIPLE LOOK PULSE BASED FREQUENCY MEASUREMENT

BACKGROUND OF THE INVENTION

The present invention relates to circuits and methods for automatically controlling the frequency of a signal in a system such as a radar in which the frequency must be maintained with a high degree of accuracy.

To date, analog instrumentation, generally featuring variations of a phase-lock-loop (PLL) device, has been used to control frequency drifts in a signal. Although devices based on analog circuitry provide adequate performance, they are often too restrictive to a particular application, and, therefore, offer little or no flexibility when the source signal to be controlled takes on a new frequency band. In a related issue, analog devices are often too costly to implement and difficult to maintain at optimum performance on a long-term basis.

A continuing need exists for improvements in the area of frequency control, particularly in the radar applications in which the primary considerations include flexibility, accuracy and low cost.

SUMMARY OF THE INVENTION

The automatic frequency control (AFC) system of the present invention measures a frequency of a source signal, such as a short duration pulsed intermediate frequency (IF) of a radar signal, and determines a frequency compensation in the event the source signal drifts. In a preferred embodiment, a radio frequency (RF) burst from a radar transmitter is modulated with a modulating frequency from a local oscillator to produce the desired IF. In the preferred embodiment the AFC system operates in two modes. In a system calibration mode, the frequencies of the source and a highly stable calibration signals are digitally measured in sequence, and their difference is stored as a reference. In a normal operation mode, the subsequent measured differences between the two signals are compared to the stored reference to determine compensation.

The AFC system includes a comparator circuit for digitizing a source signal. The digitized source signal is passed to a sampling unit to be sampled. The sampling unit includes a gate generator circuit for generating sampling pulses, and a window generator circuit for generating a window during which the gate generator circuit repeatedly passes a predefined number of sampling pulses. The gate generator circuit is asynchronously driven with respect to the signal at a predefined sampling frequency. The difference in synchronization allows a random opening effect of the sampling pulses with respect to the source signal. The AFC system further includes a source counter to count the leading edges of the digitized source signal.

The AFC system further includes a calibration circuit which includes an oscillator for producing the calibration frequency. During operation, each sampling of the digitized source sinal is followed by a sampling of a digitized calibration frequency. A count for the calibration frequency is stored in a calibration counter.

In the system calibration mode, the counts for both signals over a predefined number of previous window periods are passed to a processor which maintains a running total for each signal and computes a statistical average over the total count. The difference in the averages of the two signals is stored as a reference. In the normal operation mode, at each window period, again an average for each signal count is computed over the running total. The subsequent difference between the averaged counts of the two signals are compared to the stored reference from the calibration mode to compute frequency compensation.

In the preferred embodiment, the AFC system further includes a detector circuit for detecting any missed RF burst during the measurement process, and maintaining the pulse count accumulated just prior to such RF failure until the radar restores the RF.

The above and other features of the invention, including various novel details of construction and combinations of parts, will now be more particularly described with reference to the accompanying drawings and pointed out in the claims. It will be understood that the particular methods and devices embodying the invention is shown by way of illustration only and not as a limitation of the invention. The principles and features of this invention may be employed in varied and numerous embodiments without departing from the scope of the invention.

DETAILED DESCRIPTION OF THE INVENTION

The present invention takes advantage of high speed digital circuitry to measure and control frequencies in continuous wave mode or in short pulse durations. In particular, the invention includes digital sampling methods processed by a microprocessor to accurately determine source frequencies of short "look" durations. In a preferred embodiment, a feedback control loop is implemented to provide correction to the source as needed for source frequency drifts.

Figure 1:
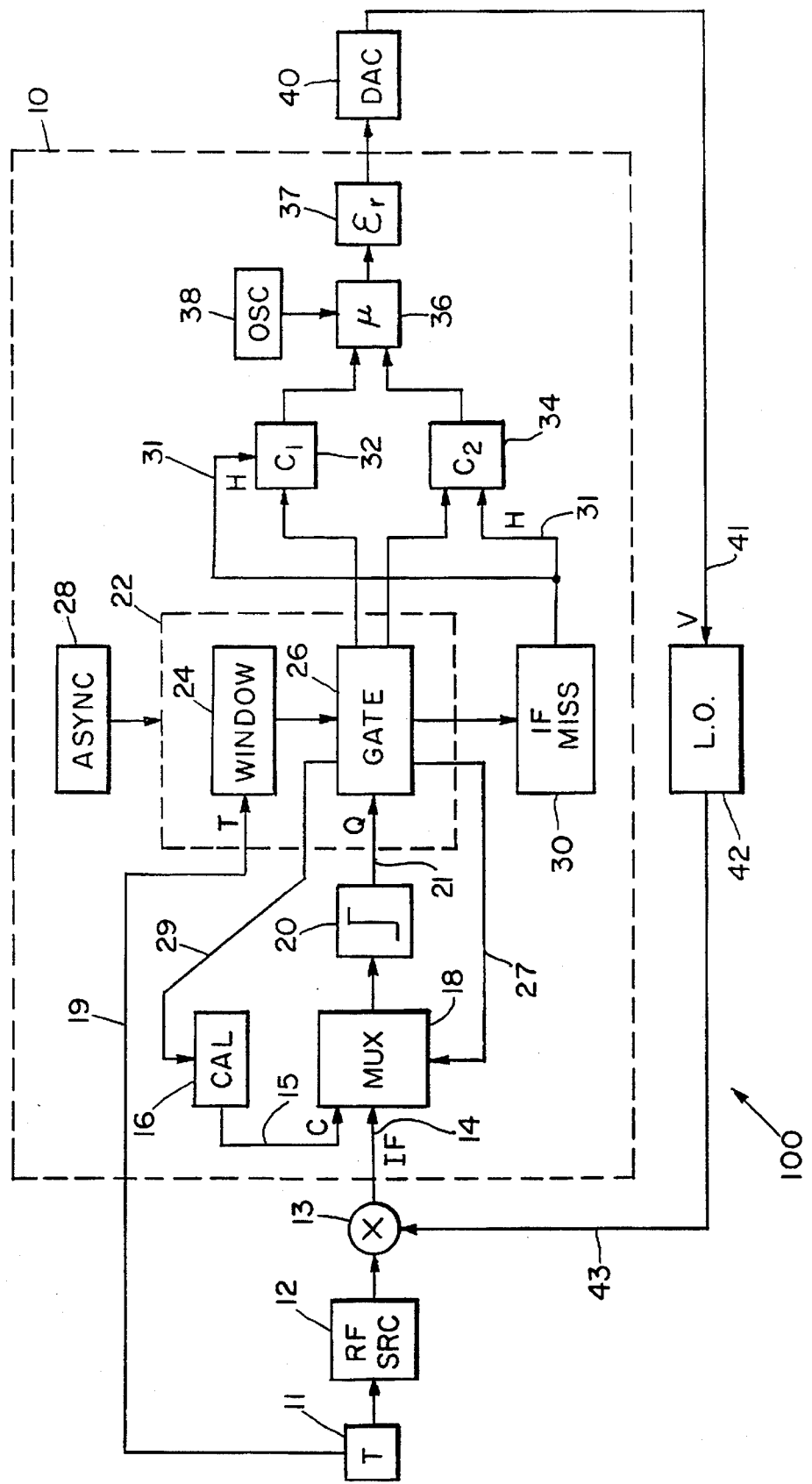
FIG. 1 is a schematic diagram of a preferred automatic frequency control system in accordance with the present invention.
Figure 2:
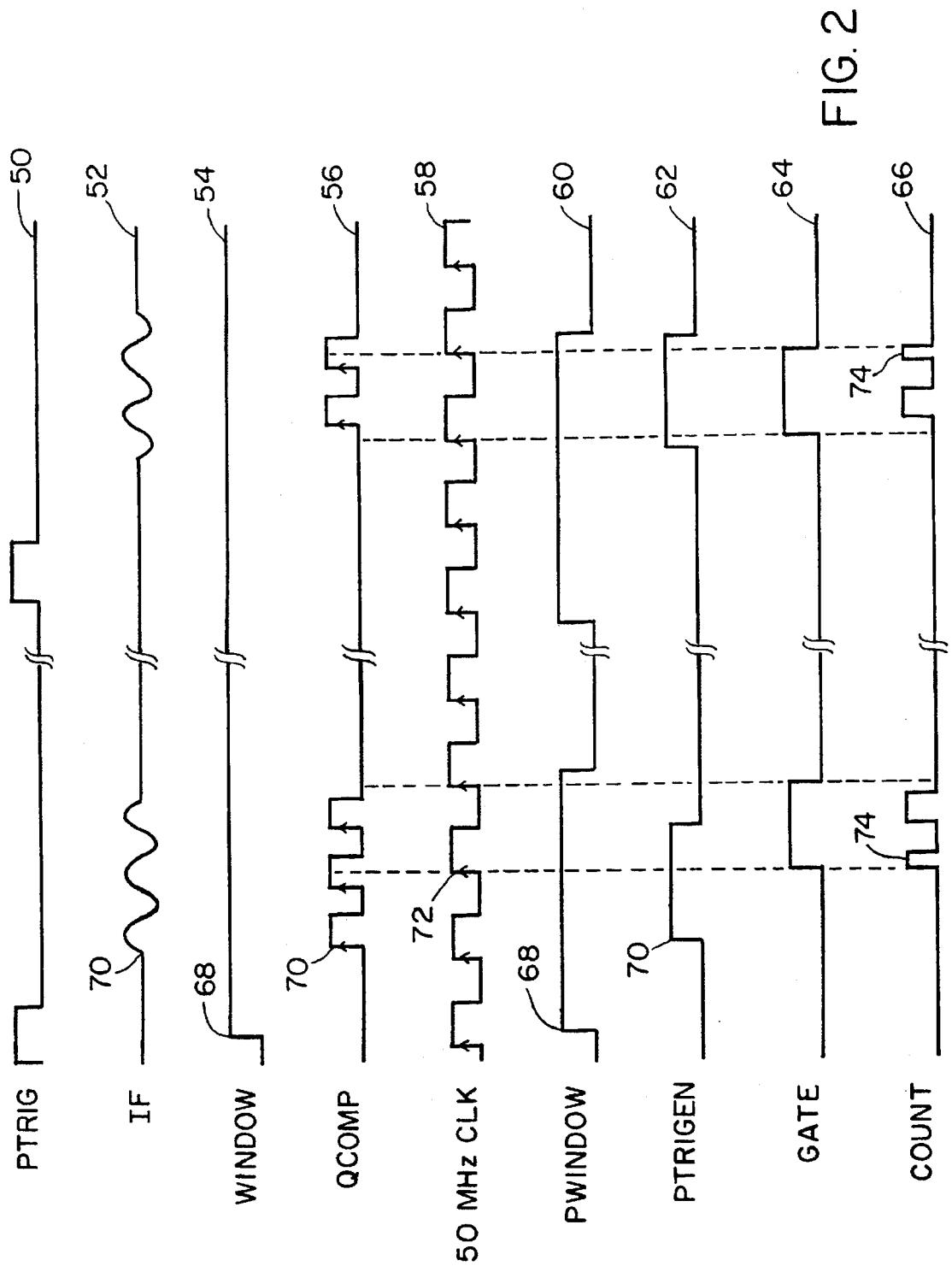
FIG. 2 is a timing diagram illustrating the timing signals of the sampling process.

Referring now to FIGS. 1 and 2 of the drawings, FIG. 1 is a schematic diagram of a preferred automatic frequency control (AFC) system 10, and FIG. 2 illustrates the signal timing sequence involved in the frequency measurement process of the present invention. The embodiment shown in FIG. 1 is illustrated as an AFC system 10 within a modulator transmitter/receiver (MTR) unit 100 of a radar system. The unit 100 comprises a trigger generator (T) 11 which activates a radio frequency (RF) transmitter 12 with a trigger pulse PTRIG 50 (see FIG. 2), such as a magnetron, of a radar. The RF is modulated at mixer 13 by a local oscillator signal generated by voltage controlled oscillator (VCO) 42 to produce a desired intermediate frequency (IF) signal 14 (shown as IF 52 in FIG. 2). Typically, the RF and IF signals are generated in short duration bursts. The RF operates in the range of 9.375 to 9.390 Ghz, and the IF in the range of 45 to 75 Mhz. In the preferred embodiment, the AFC system operates in the range of 25 Mhz to 120 MHz.

As previously indicated, the preferred AFC system operates in two modes. In the system calibration mode, the frequencies of the source and a highly stable calibration signals are digitized and sampled in sequence, and their difference is stored as a reference. In the normal operation mode, the subsequent differences between the two signals are compared to the stored reference generated from the calibration mode to determine frequency compensation, if any is needed. The two modes differ only in the final processing stage of the two sampled data. The digitizing and sampling procedures common to both modes of operation are first described below.

The preferred AFC system 10 includes an analog multiplexer (MUX) 18 for receiving two input signals, the IF signal 14 and a calibration signal 15 from a calibration logic circuit 16. The calibration circuit 16 includes a crystal oscillator (CO) to provide a highly stable frequency (C) 15 which is used as a reference. The multiplexer 18 switches the two signals in sequence to a comparator circuit 20. During operation, the multiplexer 18 first passes the source signal and then the calibration signal to the comparator circuit 20. The comparator circuit 20 converts each signal in the same sequence to a corresponding digital pulse train (Q) at 21.

In FIG. 2, for example, the digitized IF signal 52 is shown as QCOMP 56. The comparator circuit 20 compares the magnitude of the source IF 14 to a crossing threshold to determine the direction of each pulse edge. For example, in FIG. 2, as the magnitude of IF signal 52 rises and crosses a preset crossing threshold, the comparator circuit 20 generates a leading edge and begins to generate the output pulse train QCOMP 56. As the IF signal 52 declines in magnitude and crosses the threshold in the other direction, the pulse edge is dropped until another positive crossing occurs. Similarly, the calibration frequency is digitized.

Preferably, the comparator 20 provides adjustable crossing threshold control to allow fine tuning as necessary. In the embodiment of FIG. 1, for example, the preferred crossing threshold ranges from 50 to 150 mv.

Each of the digitized signals 21 from the comparator circuit 20 is passed in sequence to a pulse sampling unit 22 of the AFC system for sampling over a predetermined period. The pulse sampling unit 22 includes a window generator logic 24 and gate generator logic 26 circuits. When the RF trigger 19 occurs (see e.g., PTRIG 50 in FIG. 2), the window generator logic circuit anticipates an incoming IF pulse train and opens a "window" or predefined duration (see e.g., WINDOW 54 in FIG. 2), during which sampling of the digitized IF pulses is performed.

The window is defined by a predefined number of sampling pulses or "looks" the system passes to determine the frequency of a digital signal. Each look is enabled by a gate pulse which is generated by the gate generator logic circuit 26. The gate and window sizes vary according to the radar's Pulse Width Mode of operation. For example, in a preferred setting, for a short IF pulse, which is available only for about 40 nanoseconds, the gate size is set to 20 nanoseconds and the window size to 1000 looks. A preferred sampling setting for various IF signals are given as follows:

| Pulse Width Mode | Look/Gate (ns) | Window (# of Looks) |
| --- | --- | --- |
| Short | 20 | 1000 |
| Medium | 100 | 400 |
| Long | 400 | 100 |

These numbers are derived such that, for short pulse duration signals, a relatively larger window size and higher gate resolution (i.e., narrow sampling width) are required to ensure a sufficient count of the source. For larger pulse durations, a less gate resolution (i.e., wider sampling width) and less total looks (window) are allowed.

In the preferred embodiment, the sampling unit 22 is programmable and is asyncronously driven by a digital clock 28 at a predefined sampling frequency (see e.g., 50 MHz clock 58 in FIG. 2). The clock 28 of the preferred embodiment is activated to run freely such that the opening of a gate occurs at random with respect to the IF pulse. The randomness causes IF pulse count to vary slightly from one look to the next.

For example, in FIG. 2, a portion of the sampling sequence of an IF source signal is illustrated by way of a timing diagram. PTRIG 50 is the RF trigger signal 11 which fires an RF burst and alerts the window 24 and gate 26 generator logic circuits to a standby. Accordingly, WINDOW 54 is set to high (open). Also, shortly following the trigger signal 11, a 60 MHz short duration IF pulse 52 passes through the multiplexer 18 (see FIG. 1) to the comparator circuit 20. The comparator circuit 20 converts the analog IF pulse 52 to a digital pulse train QCOMP 56. As noted, the sampling unit 22 is driven by a free-running 50 MHz clock signal 58 (the clock itself is shown as ASYNC 28 in FIG. 1). PWINDOW 60 and PTRIGEN 62 are internally generated signals of the gate generator logic circuit 26. PWINDOW 60 is triggered on at the opening of WINDOW high 68 to signal the gate generator logic that WINDOW is open. PTRIGEN 62 is triggered on at the opening of QCOMP 70 to signal that the IF pulse is present. When both PWINDOW and PTRIGEN are high, GATE 64 opens at the next leading edge 72 of the clock pulse 58 to begin a look. For the GATE duration (dotted), COUNT 66 traces QCOMP 56 to count the leading edges of the IF pulse train. The effect is that, depending on the timing of the clock's leading edge 72 within PTRIGEN, each count of QCOMP varies slightly at random. Following a single look of an IF pulse, the system similarly samples the calibration frequency, and the process is repeated for subsequent pairs of IF and calibration signals until WINDOW terminates.

As each signal is sampled separately in sequence, each is counted and stored by one of two 12-bit counters 32 and 34 as shown in FIG. 1. In the preferred embodiment, the first counter 32 counts the IF pulses and the second counter 34 counts the calibration pulses.

Figure 3:
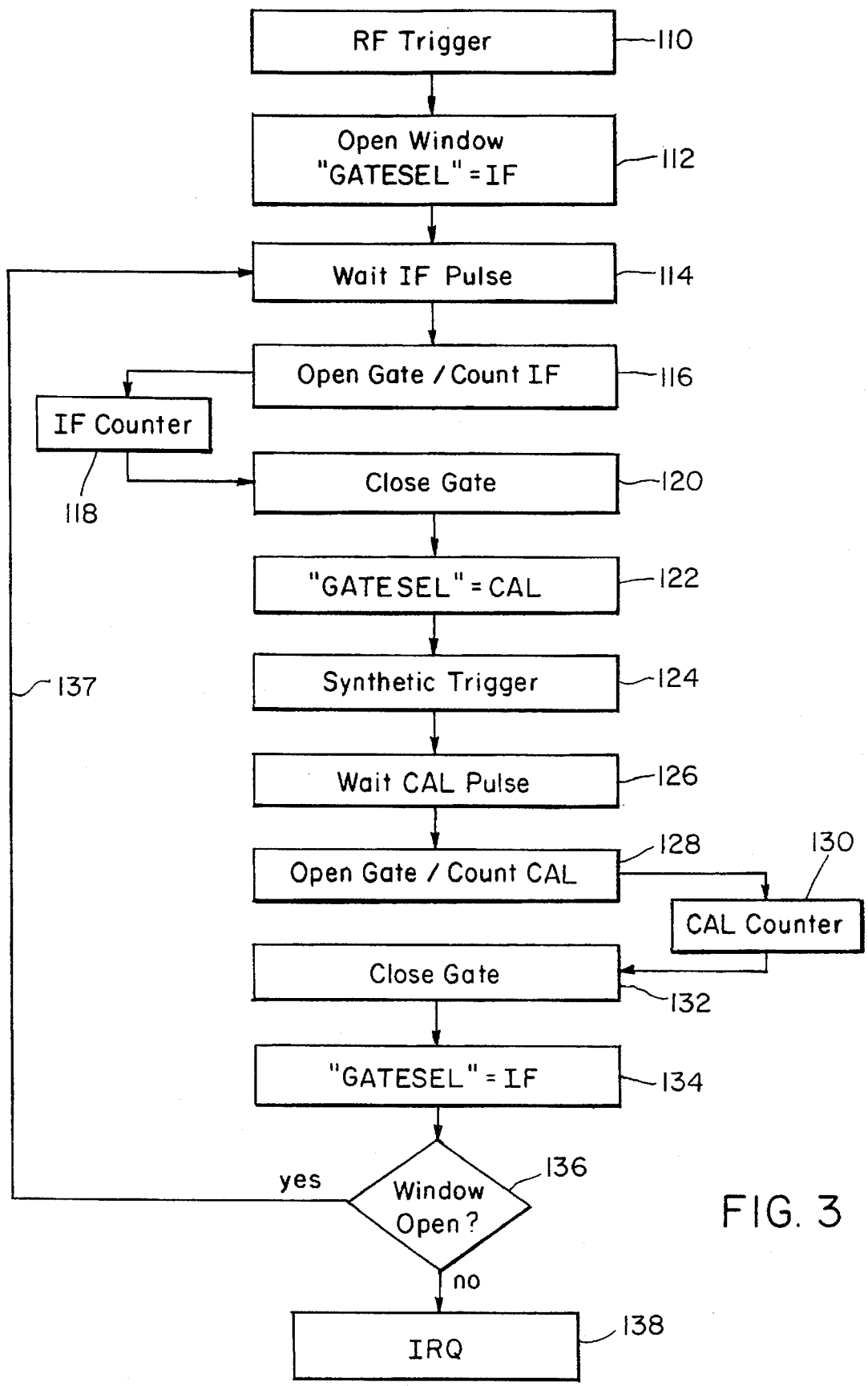
FIG. 3 is a flow diagram detailing the preferred sampling process of an IF in accordance with the present invention.

FIG. 3 describes the preferred manner in which the AFC system arranges the two counts to occur. The RF trigger signal at 110 engages the window generator logic circuit 24 (see FIG. 1) to open a window at 112. At the same time, at 112, the trigger at 110 causes an internal toggle command "GATESEL" to set the mutiplexer 18 (see FIG. 1) to first pass an IF pulse (i.e., GATESEL=IF). The "GATESEL" signal is part of the programmable logic of the gate generator logic circuit 26 and is sent through a command path 27 (see FIG. 1) to the multiplexer 18.

At 114, the gate generator logic circuit waits for the IF to occur, and, at 116 opens a sampling gate (IF gate) to begin the IF pulse count sequence. An IF count from a single sampling gate is stored in the IF counter 32 (FIG. 1) at 118. The IF gate is closed at 120, and, at 122, the toggle command, GATESEL, switches to set the multiplexer to pass a calibration signal (i.e., GATESEL=CAL). In accordance with this command, at 124, a "SYNTHETIC TRIGGER" generated by the gate generator logic 26 is sent through a command path 29 (see FIG. 1) to cause the calibration circuit 16 to fire a calibration signal.

At 126, the gate generator circuit 26 waits for an incoming calibration pulse train. A CAL gate opens at 128 and begins sampling the calibration pulse train. At 130, the resulting count is stored by the calibration counter 34 (see FIG. 1). As the CAL gate closes at 132, the GATESEL command toggles back to receive another IF signal at 134.

Upon completing a single look of both signals the gate generator logic circuit checks at 136 to see if the window is still open, if so, the process is repeated 137 to continue sampling. At the close of the window, at 138, each counter is ready to forward count data to a processor 36 (see FIG. 1) for further processing.

Figure 4:
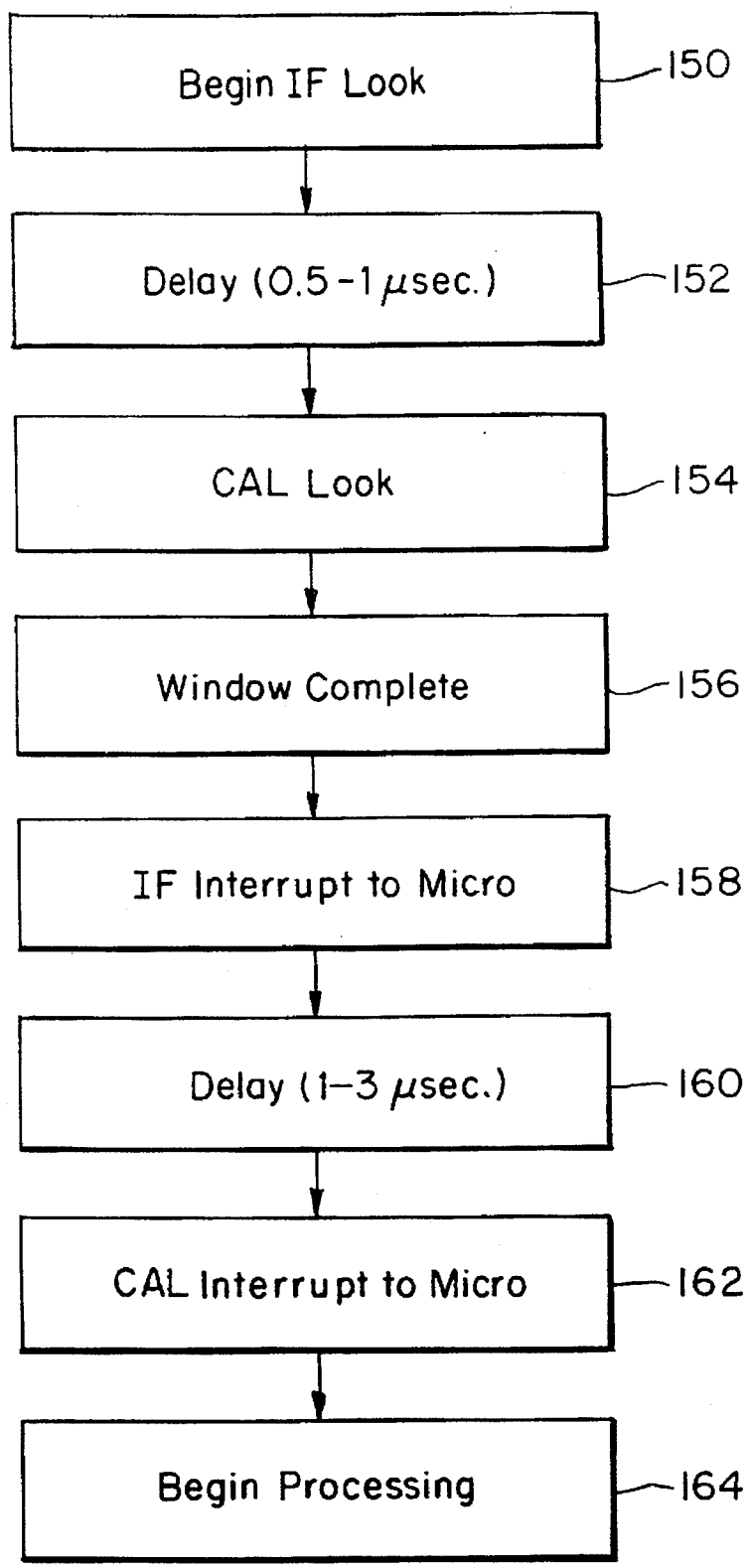
FIG. 4 is a flow diagram describing the system communication sequence in accordance with the present invention.

In the preferred embodiment, as shown in FIG. 1, the AFC system 10 includes a microprocessor 36 to process the count data from the two counters 32 and 34. FIG. 4 describes the interrupt and delay sequence detailing the timing of the IF and calibration pulse count process, and the manner in which the microprocessor receives the count data. As described above, the IF and calibration signals are sampled in sequence. In FIG. 4, between the sampling of an IF pulse, at 150, and a calibration pulse, at 154, a delay of 0.5 to 1.5 μsec is provided at 152 by the gate generator logic circuit 26 to allow the multiplexer 18 to settle. As a single window of sampling terminates at 156, each signal counter sends an interrupt request (IRQ) in sequence to the microprocessor to initiate data processing.

In the preferred embodiment, the IF counter 32 issues the first IRQ at 158. A delay of 1 to 3 μsec is provided at 160 to allow the microprocessor to respond and read the IF count data. An IRQ by the calibration counter 34 follows the IF interrupt at 162. At 164, when both counts are made available, the microprocessor 36 begins processing the two counts.

Figure 5:
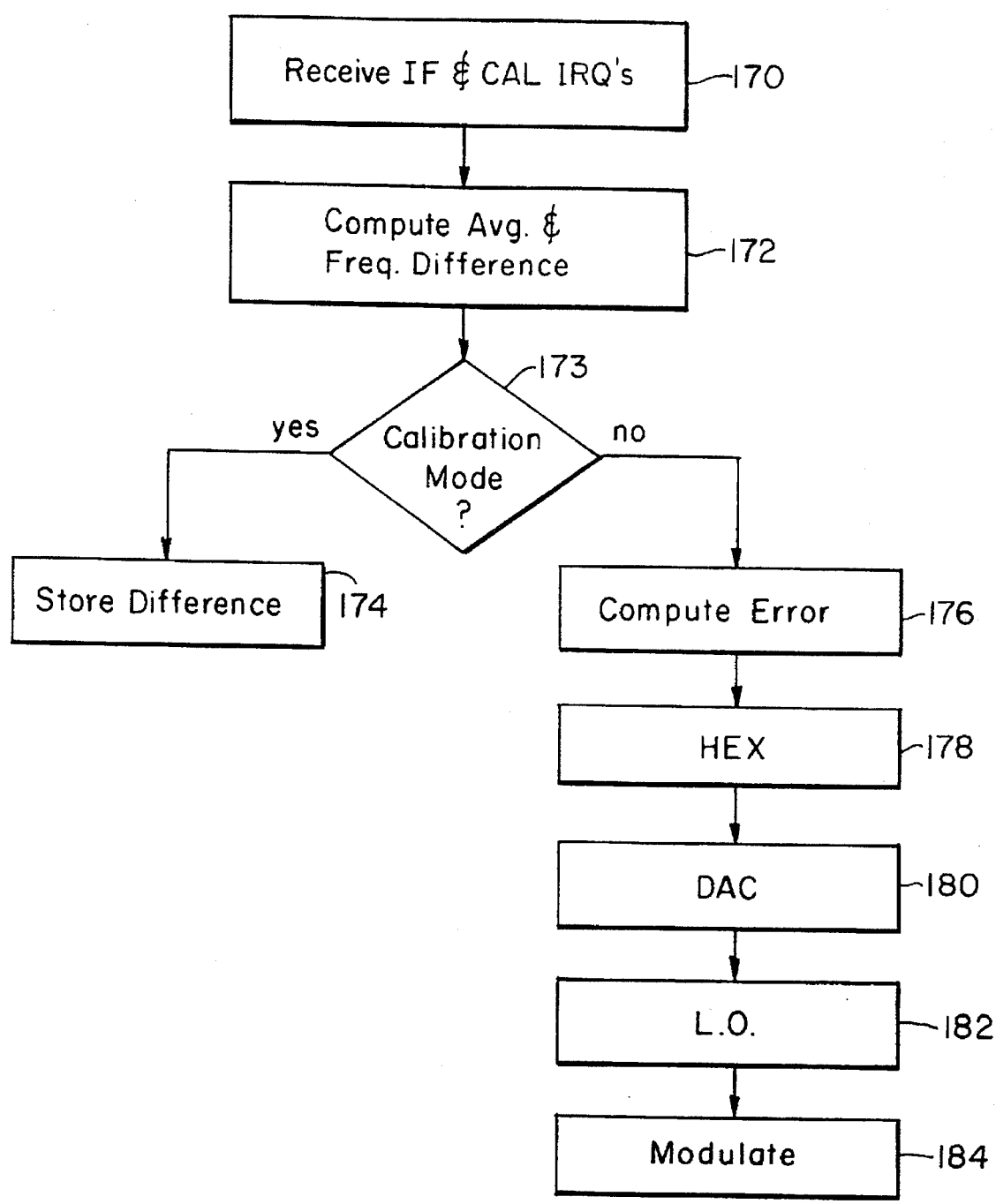
FIG. 5 is a flow diagram describing the data processing and the control loop sequence of the automatic frequency control system of the present invention.

The pulse sampling unit 22 will not initiate another count sequence until the microprocessor has responded to and processed both IRQ's in accordance with the detailed logical flow depicted in FIG. 5. The microprocessor includes a buffer to maintain a running total of a plurality of window counts for each signal. Preferably, no fewer than eight window counts are available to the microprocessor at any given time. In the preferred embodiment, at 172, at the termination of each window count, a statistical average is computed over the eight previous window counts, which include the present window count, for each signal. The averages of the two counts are compared, and the difference between the two averages are further processed according to the mode of operation.

As previously indicated the preferred AFC system mode of operation includes system calibration and normal operation modes. The calibration mode takes into account any temperature or voltage variations that may effect the results of the AFC circuitry, such as the comparator 20 and the sampling unit 22 as shown in FIG. 1.

Referring back to FIG. 5, at 173, if the system is engaged in the calibration mode, the microprocessor 36 stores in memory, at 174, the difference of the two signal count averages as a reference. Preferably, in the calibration mode, the source IF is tuned to its maximum sensitivity and performance such that the resulting reference takes into account such desired IF performance.

In the normal operation mode, at 176, the microprocessor compares a subsequent count difference of the two signals to the stored reference obtained from the calibration mode. The microprocessor 36 then computes an error or correction value as the deviation between the subsequent count difference of the two signals and the stored reference. At 178 to 180, the microprocessor 36 passes the correction value in hexadecimal, to a digital-to-analog converter (DAC) 40 (see FIG. 1). At 180, the DAC produces a corresponding voltage 41, as shown in FIG. 1, to appropriately compensate the voltage controlled local oscillator (LO) 42 of the radar unit. Again, referring to both FIG. 1 and FIG. 5, the corrected carrier frequency from LO closes the control loop 43 of the AFC system 10 and modulates, at 184, the high frequency RF source at mixer 13.

Referring back to FIG. 1, the preferred AFC system further includes a detection logic circuit 30 for monitoring any missed RF pulse from the RF source 12 during an active window. The detection of missed RF is realized when, following an RF trigger 19, no IF pulse is realized at the multiplexer 18. In such an event, the gate generator logic circuit 26 sends a signal to the detection logic circuit 30 to hold the current counts in both counters 32, 34 until the RF is restored.

Storing intermediate results, system parameters, and executable code are handled by a memory module included in the AFC system 10. The module includes both volatile and non-volatile memory. Executable code and system parameters are stored in non-volatile memory, while the intermediate results relating to sampling and count are stored in volatile memory. The AFC further provides a "Boot-Up" code, stored in non-volatile memory, which allows the system to begin functioning immediately following a "Power-up" or "Reset" condition.

The code for implementing the logic for generating the sampling gate pulse and the window size is provided in the Appendix.

Equivalents

Those skilled in the art will know, or be able to ascertain using no more than routine experimentation, many equivalents to the specific embodiments of the invention described herein. These and all other equivalents are intended to be encompassed by the following claims.

---

APPENDIX
© RAYTHEON MARINE COMPANY "1996"

```
module pwgatei2
title ' Mark J. Donovan
      Raytheon Marine Company
      Pulse window generator for gating AFC Comparator outputs'
   "  using this one on Prototype Measuremetn Breadboard 10/7/94
      pwgatei2 DEVICE'P22V10';
"input
      CLK50M   pin 1; "State Machine Clock
      QCOMP    pin 2; "Output from Zero Crossing Detector. The IF signal
      PWSEL0   pin 3; "Mode select bit
      PWSEL1   pin 4; "Mode select bit
```

-continued

APPENDIX
© RAYTHEON MARINE COMPANY "1996"

```
         SRESETN    pin 5;  "Reset signal
         PTRIG      pin 6;  "Trigger pulse from radar that indicates the start of a new PRI
         IFHIGH     pin 7;  "Output of Window detector, signifing IF signal has started high
         IFLOW      pin 8;  "Output of Window detector, signifing IF signal has started low
"output
         PWINDOW    pin 19 istype'com'; "Used internally to indicate start of window
         PTRIGEN    pin 14 istype'com'; "Used internally to indicate start of IF pulsed data
         GATE       pin 17 istype'com'; "Used to clock intermmediate Flip/Flop & counter
         IFOKAY     pin 16 isiype'com'; "Internally used to indicate start of IR pusled data
         SM4        pin 18 istype'reg'; "The remaining bits are state bits
         SM3        pin 21 istype'reg';
         SM2        pin 20 istype'reg';
         SM1        pin 23 istype'reg';
         SM0        pin 22 istype'reg';
         "EQUATES
         H,L,X,CK,Z =1,0,.X.,.C.,.Z.;
         SMSTATE    =[SM4,SM3,SM2,SM1,SM0];
         S0     =[0,0,0,0,0];
         S1     =[0,0,0,0,1];
         S2     =[0,0,0,1,0];
         S3     =[0,0,0,1,1];
         S4     =[0,0,1,0,0];
         S5     =[0,0,1,0,1];
         S6     =[0,0,1,1,0];
         S7     =[0,0,1,1,1];
         S8     =[0,1,0,0,0];
         S9     =[0,1,0,0,1];
         S10    =[0,1,0,1,0];
         S11    =[0,1,0,1,1];
         S12    =[0,1,1,0,0];
         S13    =[0,1,1,0,1];
         S14    =[0,1,1,1,0];
         S15    =[1,0,1,0,0];
         S16    =[1,0,0,0,0];
         S17    =[1,0,0,0,1];
         S18    =[1,0,0,1,0];
         S19    =[1,0,0,1,1];
         S20    =[1,0,1,0,0];
         S21    =[1,0,1,0,1];
         S22    =[1,0,1,1,0];
         S23    =[1,0,1,1,1];
         S24    =[1,1,0,0,0];
         S25    =[1,1,0,0,1];
         S26    =[1,1,0,1,0];
         S27    =[1,1,0,1,1];
         S28    =[1,1,1,0,0];
         S29    =[1,1,1,0,1];
         S30    =[1,1,1,1,0];
         S31    =[1,1,1,1,1]
         PW40   =!PWSEL1 & PWSEL0;
         PW100  =PWSEL1 & !PWSEL0;
         PW400  =PWSEL1 & PWSEL0;
equations
         [SM4.C,SM3.C,SM2.C,SM1.C,SM0.C] = CLK50M;
         [SM4.SP,SM3.SP,SM2.SP,SM1.SP,SM0.SP] = !SRESETN;
         PTRIGEN = ((IFOKAY & (SMSTATE.FB=S0) & !PTRIGEN & !PTRIG & PWINDOW)
                 #(PTRIGEN & (SMSTATE.FB=S0)));
         PWINDOW = (PTRIG&!PWINDOW)
                 #(PWINDOW&(SMSTATE.FB=S0))
                 #(PWINDOW&(SMSTATE.FB=S1));
         IFOKAY = IFHIGH & SRESETN
                 #IFLOW & SRESETN
                 #(IFOKAY & !(SMSTATE.FB=S31) & SRESETN);
         GATE = (QCOMP & PW40 & (SMSTATE.FB=S1))
                 #(QCOMP & PW100 & !(SMSTATE.FB=S0) & !(SMSTATE.FB=S1)
                    & !(SMSTATE.FB=S2) & !(SMSTATE.FB=S3) & !(SMSTATE.FB=S4)
                    & !(SMSTATE.FB=S10) & !(SMSTATE.FB=S31))
                 #(QCOMP & PW400 & !(SMSTATE.FB=S0) & !(SMSTATE.FB=S1)
                    & !(SMSTATE.FB=S2) & !(SMSTATE.FB=S3) & !(SMSTATE.FB=S4)
                    & !(SMSTATE.FB=S25) & !(SMSTATE.FB=31));
state_diagram SMSTATE
         state S0:
             IF (PTRIGEN & SRESETN) THEN S1
             ELSE S0;
         state S1:
             GOTO S2;
         state S2:
```

-continued

APPENDIX
© RAYTHEON MARINE COMPANY "1996"

```
        GOTO S3;
state S3:
        GOTO S4;
state S4:
        IF (PW40=1) THEN S31;
        ELSE S5;
state S5:
        GOTO S6;
state S6:
        GOTO S7;
state S7:
        GOTO S8;
state S8:
        GOTO S9;
state S9:
        GOTO S10;
state S10:
        IF (PW100=1) THEN S31;
        ELSE S11;
state S11:
        GOTO S12;
state S12:
        GOTO S13;
state S13:
        GOTO S14;
state S14:
        GOTO S15;
state S15:
        GOTO S16;
state S16:
        GOTO S17;
state S17:
        GOTO S18;
state S18:
        GOTO S19;
state S19:
        GOTO S20;
state S20:
        GOTO S21;
state S21:
        GOTO S22;
state S22:
        GOTO S23;
state S23:
        GOTO S24;
state S24:
        GOTO S25;
state S25:
        IF (PW400=1) THEN S31;
        ELSE S0;
state S26:
        GOTO S0;
state S27:
        GOTO S0;
state S28:
        GOTO S0;
state S29:
        GOTO S0;
state S30:
        GOTO S0;
state S31:
        GOTO S0;
test_vectors
([PWSEL0]->[GATE]);
[0]->[X];
end pwgatei2
```

We claim:

1. A system comprising:

a comparator for digitizing a source signal to generate a corresponding digital pulse train;

a gate generator for generating sampling pulses each having a predefined width to obtain a source count of the digital pulse train;

a window generator for generating a timing window during which the gate generator repeatedly passes a predefined number of said sampling pulses at a sampling frequency;

a counter for storing the source count as obtained by the gate generator for a period defined by the window; and a processor for computing a statistical average of the source count.

2. A system as claimed in claim 1 wherein the processor includes a buffer to maintain a running source count total obtained from a plurality of the windows and computes a statistical average of the source count over the running total.

3. A system as claimed in claim 1 further comprising a calibration circuit which includes an oscillator for producing a calibration frequency, wherein the calibration frequency is digitized, sampled and counted, in a system calibration mode, to obtain a calibration count such that a difference between the calibration count and source count provides a reference, and the microprocessor stores the reference in memory.

4. A system as claimed in claim 3 further comprising a calibration counter for storing the calibration count.

5. A system as claimed in claim 3 wherein a new source signal and calibration frequency are digitized, sampled and counted in sequence, in a normal operation mode, to provide new source and calibration counts such that a difference between the new source and calibration counts is compared to the reference by the microprocessor to determine a deviation from the reference.

6. A system as claimed in claim 5 wherein the microprocessor provides a correction signal based on the deviation.

7. A system as claimed in claim 6 wherein the correction signal from the microprocessor is processed by a digital-to-analog converter to provide a corresponding voltage.

8. A system as claimed in claim 7 wherein the voltage is received by a voltage controlled oscillator to generate a compensated frequency.

9. A system as claimed in claim 1 wherein the gate generator is driven asyncronously with respect to the digital pulse train such that timing of the sampling pulses is random with respect to the digital pulse train.

10. A system as claimed in claim 1 wherein the source signal is an intermediate frequency signal of a radar, the radar providing a transmitter circuit which, upon a trigger command, generates a radio frequency burst which is modulated with a modulating signal from a local oscillator to provide the intermediate frequency signal.

11. A system as claimed in claim 10 further comprising a detector circuit to maintain a current source count in the counter in the event the transmitter circuit fails to generate the frequency burst upon the trigger command.

12. A method of controlling frequency of a radar signal comprising:

transmitting a source signal to a control circuit;

digitizing the source signal to generate a corresponding digital pulse train;

sampling the digital pulse train with sampling pulses each having a predefined width to obtain a source count of the digital pulse train;

generating a timing window in which a predefined number of said sampling pulses are passed at a sampling frequency;

storing the source count obtained during a period defined by the window in a counter; and computing a statistical average of the source count with a processor.

13. A method as claimed in claim 12 wherein the processor includes a buffer to maintain a running source count total obtained from a plurality of the windows and computes a statistical average of the source count over the running total.

14. A method as claimed in claim 12 further comprising providing a calibration frequency generated by an oscillator of a calibration circuit, digitizing, sampling and counting the calibration frequency, in a system calibration mode, to obtain a calibration count such that a difference between the calibration count and source count provides a reference, and storing the reference in memory.

15. A method as claimed in claim 14 further comprising storing the calibration count in a calibration counter.

16. A method as claimed in claim 14 further comprising digitizing, sampling and counting a new source signal and a new calibration frequency in sequence, in a normal operation mode, to provide new source and calibration counts such that a difference between the new source and calibration counts is compared to the reference to determine a deviation from the reference.

17. A method as claimed in claim 16 further comprising providing a correction signal based on the deviation.

18. A method as claimed in claim 17 further comprising passing the correction signal to a digital-to-analog converter to provide a corresponding voltage.

19. A method as claimed in claim 18 further comprising passing the voltage to a voltage controlled oscillator to generate a compensated frequency.

20. A method as claimed in claim 12 wherein the sampling pulses are driven asyncronously with respect to the digital pulse train such that timing of the sampling pulses is random with respect to the digital pulse train.

21. A method as claimed in claim 12 wherein the source signal is an intermediate frequency signal of a radar, the radar providing a transmitter circuit which, upon a trigger command, generates a radio frequency burst which is modulated with a modulating signal from a local oscillator to provide the intermediate frequency signal.

22. A method as claimed in claim 21 wherein a detector circuit maintains a current source count in the counter in the event the transmitter circuit fails to generate the frequency burst upon the trigger command.

* * * * *